United States Patent
Jung

(10) Patent No.: US 9,469,800 B2
(45) Date of Patent: Oct. 18, 2016

(54) ABRASIVE PARTICLE, POLISHING SLURRY, AND METHOD OF MANUFACTURING SEMICONDUCTOR DEVICE USING THE SAME

(71) Applicant: UBMATERIALS INC., Yongin-Si, Gyeonggi-do (KR)

(72) Inventor: Seung Won Jung, Anyang-Si (KR)

(73) Assignee: INDUSTRIAL BANK OF KOREA (KR)

( * ) Notice: Subject to any disclaimer, the term of this patent is extended or adjusted under 35 U.S.C. 154(b) by 0 days.

(21) Appl. No.: 14/483,135

(22) Filed: Sep. 10, 2014

(65) Prior Publication Data

US 2015/0072522 A1     Mar. 12, 2015

(30) Foreign Application Priority Data

Sep. 12, 2013     (KR) .................. 10-2013-0109871

(51) Int. Cl.
| | |
|---|---|
| *H01L 21/28* | (2006.01) |
| *H01L 21/3205* | (2006.01) |
| *H01L 21/321* | (2006.01) |
| *C09K 3/14* | (2006.01) |
| *C09G 1/02* | (2006.01) |
| *C09G 1/04* | (2006.01) |
| *H01L 21/3105* | (2006.01) |
| *H01L 27/115* | (2006.01) |

(52) U.S. Cl.
CPC ............... *C09K 3/1409* (2013.01); *C09G 1/02* (2013.01); *C09G 1/04* (2013.01); *C09K 3/1436* (2013.01); *H01L 21/31053* (2013.01); *H01L 27/115* (2013.01)

(58) Field of Classification Search
CPC ........................... H01L 21/3212; C09K 3/14
USPC .............................................. 438/692; 51/295
See application file for complete search history.

(56) References Cited

U.S. PATENT DOCUMENTS

| | | | |
|---|---|---|---|
| 6,221,118 B1 | 4/2001 | Yoshida et al. | |
| 6,343,976 B1 | 2/2002 | Yoshida et al. | |
| 2004/0060502 A1 | 4/2004 | Singh | |
| 2004/0211337 A1* | 10/2004 | Lee .................... | C09G 1/02 |
| | | | 428/693.1 |
| 2006/0032150 A1* | 2/2006 | So .................... | B82Y 30/00 |
| | | | 51/309 |

(Continued)

FOREIGN PATENT DOCUMENTS

| | | |
|---|---|---|
| CN | 1366549 A | 8/2002 |
| CN | 103260827 A | 8/2013 |

(Continued)

OTHER PUBLICATIONS

Yanagihara Et Al JP 2013111725 AE Jun. 10, 2013 English translation.pdf.*

*Primary Examiner* — Moazzam Hossain

(57) ABSTRACT

Provided are an abrasive particle including auxiliary particles formed on a surface of a mother particle, a polishing slurry prepared by mixing the abrasive particles with a polishing accelerating agent and a pH adjusting agent, and a method of manufacturing a semiconductor device in which an insulating layer is polished by the polishing slurry while using a conductive layer as a polishing stop layer.

17 Claims, 12 Drawing Sheets

(56) References Cited

U.S. PATENT DOCUMENTS

| | | | |
|---|---|---|---|
| 2006/0032836 A1* | 2/2006 | Feng | B82Y 30/00 216/88 |
| 2006/0197054 A1* | 9/2006 | Akahori | B24B 37/04 252/79.1 |
| 2006/0246723 A1* | 11/2006 | Park | H01L 21/31053 438/692 |
| 2007/0254484 A1 | 11/2007 | Feng et al. | |
| 2007/0281160 A1* | 12/2007 | Krishna | B01D 69/02 428/403 |
| 2010/0009539 A1* | 1/2010 | Oh | B24B 37/044 438/693 |
| 2011/0045745 A1* | 2/2011 | De Messemaeker | B82Y 30/00 451/41 |
| 2011/0056142 A1 | 3/2011 | Sheridan | |
| 2011/0219704 A1* | 9/2011 | Moon | B24B 55/12 51/309 |
| 2012/0171936 A1* | 7/2012 | Haerle | B24B 37/044 451/59 |
| 2012/0248597 A1* | 10/2012 | Enda | H01L 21/3081 257/734 |
| 2015/0017806 A1* | 1/2015 | Akutsu | C09K 3/1409 438/693 |
| 2015/0247062 A1* | 9/2015 | Nagai | B24B 57/00 51/309 |

FOREIGN PATENT DOCUMENTS

| | | |
|---|---|---|
| JP | 2243270 | 9/1990 |
| JP | 8325558 | 12/1996 |
| JP | 2011510900 | 4/2011 |
| JP | 2011511751 | 4/2011 |
| JP | 2012104800 A | 5/2012 |
| JP | 201316830 | 1/2013 |
| JP | 2013104023 | 5/2013 |
| JP | 2013111725 A * | 6/2013 |
| JP | 2013129056 A | 7/2013 |
| KR | 200596014 A | 10/2005 |
| TW | 201137065 A | 11/2011 |
| TW | 201230182 A | 7/2012 |
| WO | 03070853 | 8/2003 |
| WO | 2006059627 | 6/2006 |
| WO | 2013042596 | 3/2013 |

* cited by examiner (a)

(b)

(a)

(b)

(a)  (b)  (c)

(a)

(b)

(a)

(b)

(a)

(b)

(a)　　　(b)　　　(c)

(a)

(b)

(a)

(b)

(a)

(b)

(c)

ABRASIVE PARTICLE, POLISHING SLURRY, AND METHOD OF MANUFACTURING SEMICONDUCTOR DEVICE USING THE SAME

CROSS-REFERENCE TO RELATED APPLICATION

This application claims priority to Korean Patent Application No. 10-2013-0109871 filed on Sep. 12, 2013 and all the benefits accruing therefrom under 35 U.S.C. §119, the contents of which are incorporated by reference in their entirety.

BACKGROUND

The present disclosure relates to an abrasive particle and a polishing slurry, and more particularly, to an abrasive particle and a polishing slurry capable of improving the polishing rate of a target layer to be polished and decreasing micro scratches.

A chemical mechanical polishing (CMP) process is conducted by a polishing pad equipped in a polishing apparatus after a slurry containing abrasive particles is put on a substrate. In this regard, the abrasive particles mechanically polish a surface of the substrate with a pressure applied from the polishing apparatus, and chemical components contained in the slurry chemically react with the surface of the substrate to chemically remove a portion of the surface of the substrate. The abrasive particles may include—for example, ceria ($CeO_2$), and the like, and may be selectively used according to target layers to be polished.

Meanwhile, in existing methods of manufacturing a NAND flash memory, the shallow trench isolation (STI) process in which a nitride layer is used as a hard mask in order to form a device isolation layer is conducted. That is, a nitride layer is first formed on a substrate, a trench is formed on a predetermined region of the substrate, an oxide layer is formed to fill the trench, and the oxide layer is polished to form a device isolation layer. In this regard, the oxide is polished using a dry ceria slurry capable of securing a high polishing selection ratio of the oxide layer and the nitride layer until the nitride layer is exposed, and then the remaining nitride layer is removed by a wet etching. However, when the device scale is reduced to 20 nm or less, loss of the oxide layer occurs during the wet etching of the nitride layer and leakage current sharply increases between devices due to the loss of the oxide layer, so that the devices may be erroneously operated.

To solve the above-described problems, a new CMP process has been developed, which uses a polysilicon layer used as a floating gate as a polishing stop layer instead of using the nitride layer as a hard mask. That is, a tunnel insulating layer and a polysilicon layer are formed on a substrate, the polysilicon layer, the tunnel insulating layer and the substrate are sequentially etched to form a trench, an insulating layer is formed to fill the trench, and then the insulating layer is polished until the polysilicon layer is exposed, thereby forming a device isolation layer. Herein, when surface defects, particularly, micro scratches are generated in the polysilicon layer used as a floating gate after the CMP process, the generated micro scratches have an influence on the threshold voltage of devices. Then, since the dry ceria particles have an angular grain shape and a wide grain size distribution as shown in FIG. 1 due to limitations of the manufacturing method, the application of such dry ceria particles to the CMP process for forming NAND flash memory devices inevitably creates micro scratches. Compared with the dry ceria particles, since wet ceria particles have a relatively narrow grain size distribution, do not create particles having a large secondary particle diameter, and have a polyhedral structure as shown in FIG. 2, the wet ceria particles may greatly improve micro scratches compared with the dry ceria particles. However, when the size of the wet ceria particles is not larger than 40 nm, the polishing rate of the insulating layer is very low, and the size of the wet ceria particles is 100 nm or larger, the number of micro scratches is sharply increased due to sharp crystal faces of the polyhedral structure.

Meanwhile, U.S. Pat. Nos. 6,221,118 and 6,343,976 disclose a method of synthesizing a ceria particle used for polishing an insulating layer in a shallow trench isolation (STI) process, and a substrate polishing method using the same. The related arts also disclose an average particle diameter and a particle diameter distribution range of abrasive particles required for the characteristics of a slurry for polishing an insulating layer. However, since the ceria particles disclosed in the above-described related arts substantially include macro abrasive particles causing micro scratches, the ceria particles fail to suppress creation of micro scratches.

SUMMARY

The present disclosure provides an abrasive particle and a polishing slurry capable of improving a polishing ratio of a target layer to be polished and minimizing micro scratches.

The present disclosure also provides an abrasive particle and a polishing slurry capable of improving a polishing ratio of a target layer to be polished and minimizing micro scratches by decreasing sharp crystal faces of the abrasive particle having a polyhedral structure.

In accordance with an exemplary embodiment, an abrasive particle includes: a mother particle having a polyhedral crystal face; and a plurality of auxiliary particles which are formed on a surface of the mother particle and grown and protruded outward.

The plurality of auxiliary particles may be respectively grown and formed from an edge portion of the mother particle.

The plurality of auxiliary particles may be formed so as to cover a portion of each of crystal faces centered on an edge portion where at least three crystal faces among the polyhedral crystal faces meet.

The plurality of auxiliary particles adjacent to each other may be spaced apart from each other or contact each other.

The plurality of auxiliary particles contacting each other may have an overlapping height ranging from 0% to 70% to a maximum height thereof.

Each of the mother particle and the plurality of auxiliary particles may include a ceria particle.

The auxiliary particle to the mother particle may be formed at a size ratio of 100:1 to 5:1.

The abrasive particle may have an average particle diameter ranging from 6 nm to 350 nm.

The mother particle may have an average particle diameter ranging from 5 nm to 300 nm.

The auxiliary particle may have an average particle diameter ranging from 1 nm to 50 nm.

In accordance with another exemplary embodiment, a slurry for polishing a target workpiece, includes an abrasive particle performing polishing and having a plurality of protrusions protruded outward from a surface thereof; and a dispersing agent containing deionized water, in which the abrasive particle is dispersed.

The abrasive particle may include polyhedral crystal faces, and the plurality of protrusions are formed and grown from an edge where at least two of the polyhedral crystal faces meet.

The protrusions to the polyhedral crystal faces may be formed at a size ratio of 100:1 to 5:1.

The abrasive particle may be contained in an amount ranging from 0.1 wt % to 5 wt % based on a solid content.

The above slurry may further include a polishing accelerating agent accelerating polishing, wherein the polishing accelerating agent includes a cationic low molecular weight polymer, a cationic high molecular weight polymer, a hydroxylic acid, and an amino acid, which convert a surface potential of the abrasive particle to a minus potential.

The polishing accelerating agent may be contained in an amount of 0.01 wt % to 0.1 wt % based on 1 wt % of the abrasive particle.

The cationic low molecular and high molecular polymers may include at least one of an oxalic acid, a citric acid, a polysulfonic acid, a polyacrylic acid, a polymethacrylic acid (Darvan C-N), copolymeric acids thereof, or salts thereof, the hydroxylic acid includes at least one of a hydroxylbenzoic acid, an ascorbic acid, or salts thereof, and the amino acid includes at least one of a picolinic acid, a glutaminic acid, a tryptophan acid, an aminobutylic acid, or salts thereof.

The above slurry may further include a pH adjusting agent adjusting pH of the slurry, wherein the slurry has a pH which is maintained in a range of 4 to 9 by the pH adjusting agent.

In accordance with yet another exemplary embodiment, a method of manufacturing a semiconductor device, includes: forming a tunnel insulating layer and a conductive layer on a substrate; etching predetermined regions of the conductive layer, the tunnel insulating layer and the substrate to a predetermined depth to form a trench; forming an insulating layer such that the trench is filled; and polishing the insulating layer such that the conductive layer is exposed, wherein the polishing is conducted using a polishing slurry containing an abrasive particle comprising a mother particle and a plurality of auxiliary particles formed on a surface of the mother particle.

The conductive layer may include a polycrystalline silicon layer, and the insulating layer may include an oxide-based material.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, exemplary embodiments will be described in detail with reference to the accompanying drawings. The present disclosure may, however, be embodied in many different forms and should not be construed as being limited to the embodiments set forth herein; rather, these embodiments are provided so that this disclosure will be thorough and complete, and will fully convey the concept of the invention to those skilled in the art. Further, the present disclosure is only defined by scopes of claims.

Figure 3:
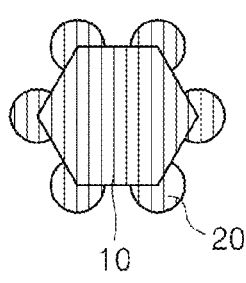
FIG. 3 is a schematic view of abrasive particles according to an embodiment of the present disclosure.
Figure 3:
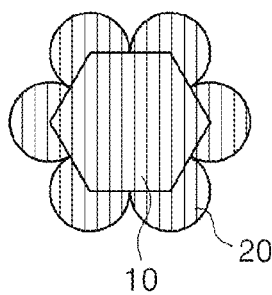
Figure 3:
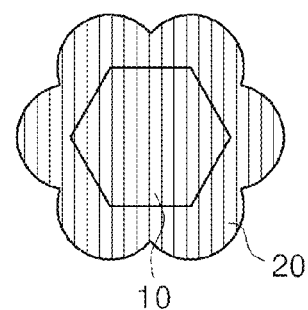

FIG. 3 is a schematic view of abrasive particles according to an embodiment of the present disclosure.

Referring to FIG. 3, an abrasive particle according to an embodiment of the present disclosure includes a mother particle 10, and a plurality of auxiliary particles 20 provided to a surface of the mother particle 10.

The mother particle 10 may include particles, such as ceria (CeO2), and the like. Also, the mother particle 10 may be analyzed through an XRD measurement, and has the same crystal structure as the wet ceria and has polyhedral crystal faces. Meanwhile, the mother particle 10 may be provided in an average particle diameter ranging from 5 nm to 300 nm, preferably ranging from 20 nm to 100 nm, and more preferably ranging from 40 nm to 70 nm. When the average particle diameter of the mother particle 10 is so small, the target layer to be polished is not easily polished so that the polishing rate is reduced, and when the average particle diameter of the mother particle 10 is so large, the mother particle 10 is again grown up to a polyhedral structure to generate micro scratches in the polishing stop layer. Therefore, the mother particle 10 may have an average particle diameter in such a range that does not reduce the polishing rate of the target layer to be polished and does not generate micro scratches in the polishing stop layer.

The auxiliary particle 20 is formed in plurality on a surface of the mother particle 10, and may be formed protruding outward from a plurality of corner portions of the mother particle 10. That is, the auxiliary particles 20 may be formed so as to cover at least a portion of each crystal face from a corner portion where at least three crystal faces meet. The auxiliary particle 20 may include ceria (CeO2), and the like. That is, the auxiliary particle 20 may be formed of the same material as the mother particle 10, or a material that is not the same as the mother particle 10, and it is preferable that the auxiliary particle 20 be formed of the same material as the mother particle 10. In this regard, the auxiliary particles 20 may be grown in various sizes depending on the growing conditions, such as the size of the mother particle 10, growing time, growing temperature, and the like, and the adjacent auxiliary particles 20 may be formed spaced apart from each other as shown in FIG. 3A or contacting each other as shown in FIG. 3B. Also, in case the auxiliary particles 20 contact each other, the auxiliary particles 20 are grown up on faces between corners of the mother particle 10 according to the growing time of the auxiliary particles 20, so that the adjacent auxiliary particles 20 may overlap each other. In this regard, in case the adjacent auxiliary particles 20 overlap each other, the overlapping portions of the auxiliary particles 20 are formed with a height greater than 0 and less than 70 when it is assumed that the maximum height of the auxiliary particles 20 is 100. That is, the overlapping portions of the auxiliary particles 20 may be formed with a height between 0 and 70% with respect to the maximum height of the auxiliary particles 20 which is the farthest distance of the auxiliary particles 20 from the surface of the mother particle 10. In this regard, when the overlapping portions of the auxiliary particles 20 are too high, the abrasive particle becomes too large and is again grown up to a polyhedral structure, so that the abrasive particle may cause occurrence of micro scratch in the polishing stop layer. Meanwhile, these auxiliary particles 20 may be formed in a size ratio ranging from 1:300 to 1:5 with respect to the size of the mother particle 10. For example, when the mother particle 10 is provided with an average particle diameter ranging from 5 nm to 300 nm, the auxiliary particles 20 may be provided with an average particle diameter ranging from 1 nm to 50 nm, preferably from 3 nm to 20 nm, and more preferably from 5 nm to 10 nm. That is, the particle diameter of one auxiliary particle 20 may be defined as a distance from the surface of the mother particle 10 to the farthest distance of the corresponding auxiliary particle 20, and the average particle diameter of the auxiliary particles 20 defined thus may be provided in a range of 1 nm to 50 nm. Then, when the average particle diameter of the auxiliary particles 20 is too small, the auxiliary particles 20 fail to reduce the sharpness of the crystal faces of the mother particle 10 and thus fail to prevent occurrence of micro scratches in the polishing stop layer, and when the average particle diameter of the auxiliary particles 20 is too large, the auxiliary particles 20 are again grown up to a polyhedral structure surrounding the mother particle 10, so that the auxiliary particles 20 may cause occurrence of micro scratches in the polishing stop layer. Accordingly, the abrasive particle according to an embodiment of the present disclosure may be provided with an average particle diameter from one auxiliary particle 20 to another auxiliary particle 20 through the mother particle 10 ranging from 6 nm to 350 nm, preferably from 20 nm to 150 nm, and more preferably from 40 nm to 80 nm That is, the distance between the auxiliary particles 20 that are farthest away from each other through the mother particle 10 may be in a range of 6 nm to 350 nm.

Hereinafter, a method of manufacturing an abrasive particle according to an embodiment of the present disclosure will be described.

Figure 4:
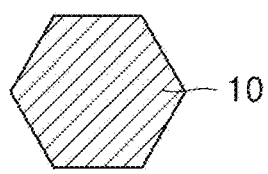
FIGS. 4 to 6 are schematic views and photographs of abrasive particles obtained by a manufacturing method according to an embodiment of the present disclosure.
Figure 4:
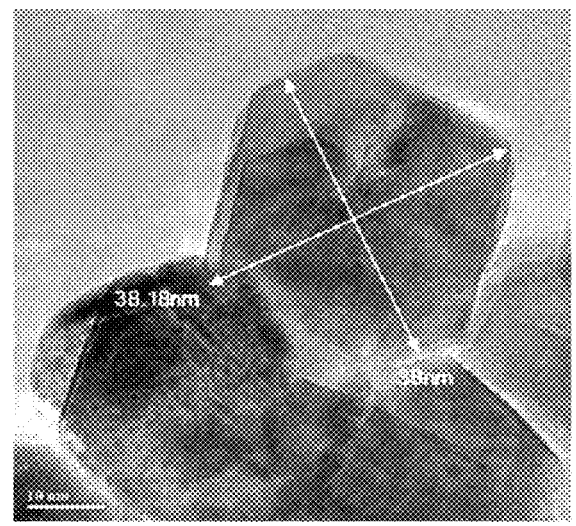

First, a precursor—for example, a cerium aqueous solution is prepared by mixing a cerium salt with deionized water. The cerium salt and the deionized water may be mixed at a ratio of—for example, 2:1 to 4:1. The cerium salt used herein may be at least one of Ce(III) salt and Ce(IV) salt. That is, at least one Ce(III) salt may be mixed with deionized water, at least one Ce(IV) salt may be mixed with deionized water, or Ce(III) salt and Ce(IV) salt may be mixed with deionized water. The Ce(III) salt may include cerium chloride, cerium bromide, cerium nitrate, acetate cerium chloride, and the like, and the Ce(IV) salt may include cerium ammonium nitrate, cerium sulfate, and the like. Preferably, the Ce(III) salt may be cerium nitrate, and the Ce(IV) salt may be cerium ammonium nitrate. Meanwhile, in order to stabilize the cerium aqueous solution prepared by mixing cerium salt with deionized water, an acid solution may be mixed. The acid solution and the cerium aqueous solution may be mixed at a ratio of 1:1 to 1:100. The acid solution may include oxygenated water, a nitric acid, an acetic acid, a hydrochloric acid, a sulfuric acid, and the like. Separately from the cerium aqueous solution, an alkaline solution is prepared. The alkaline solution may be prepared by mixing ammonia, sodium hydrate, potassium hydrate, or the like with deionized water and diluting the mixture to a proper concentration. The alkaline material and the deionized water may be diluted at a ratio of 1:1 to 1:100. The alkaline solution diluted thus is loaded in a reaction container and then stirred—for example, for a time not more than 5 hours in an atmosphere of inert gas, such as nitrogen, argon, helium, or the like. The cerium aqueous solution is added in the reaction container in which the diluted alkaline solution is loaded and is mixed with the alkaline solution, for example, at a rate of 0.1 l per second, and the mixture is thermally treated at a predetermined temperature. The thermal treatment temperature may be 100° C. or lower—for example, a temperature exceeding 60° C. and not higher than 100° C., and the heat treatment time may be 24 hours or less—for example, 1 hour to 24 hours. Also, the temperature rise rate from room temperature to the thermal treatment temperature may be, for example, 0.5° C./min. The mixture solution which has been subject to the heat treatment is cooled within two hours to 60° C. or lower—for example, room temperature to 60° C. Through the above processes, a mixture solution in which the mother particle 10 having a particle diameter of 80 nm or less is mixed is prepared. That is, the mother particle 10 is formed in a polyhedral structure having sharp crystal faces without any auxiliary particles on a surface thereof as shown in the schematic view of FIG. 4A and the photograph of FIG. 4B.

Figure 5:
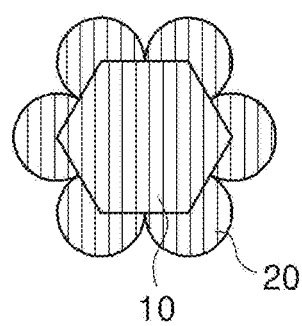
Figure 5:
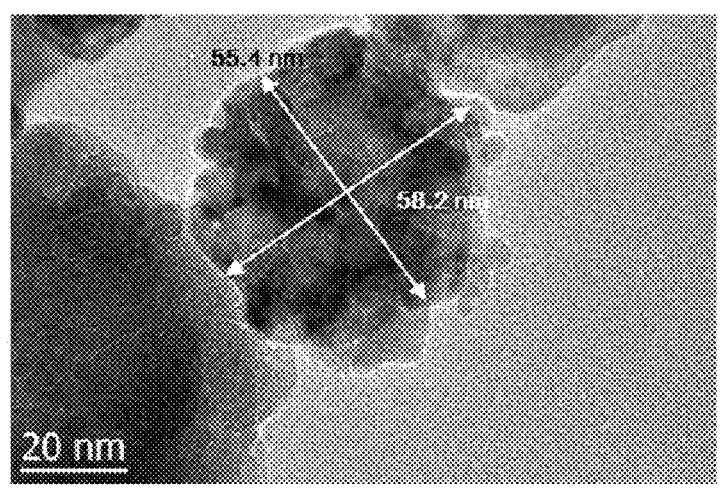

Next, in a state that the atmosphere of inert gas is maintained, the alkaline solution is further added in the mixture solution in which the mother particle 10 is mixed and then stirring is performed for a time of 5 hours or less. In this regard, the alkaline solution may be, for example, ammonia that is not diluted by deionized water. A cerium aqueous solution prepared by mixing cerium salt with deionized water at a mixing ratio of 2:1 to 4:1 is mixed with the mixture solution in which the mother particle 10 is mixed, and the resultant solution is then heated at a temperature of 100° C. or lower—for example, at a temperature exceeding 60° C. and not higher than 100° C. to perform heat treatment for a time of 24 hours or less. In this regard, the resultant mixture solution may be heated from room temperature to 40° C. to the heat treatment temperature at a temperature rise rate of 0.5° C./min. The mixture solution which has been subject to the heat treatment for 24 hours or less is cooled within two hours to 60° C. or lower—for example, room temperature to 60° C. Through the above processes, an abrasive particle having a plurality of auxiliary particles 20 formed on the surface of the mother particle 10 and having a primary particle diameter of 90 nm or less is formed as shown in the schematic view of FIG. 5A and the photograph of FIG. 5B. Meanwhile, the bonding force between the mother particle 10 and the auxiliary particles 20 may be adjusted according to the heat treatment time. That is, when the heat treatment time is lengthened, the bonding force between the mother particle 10 and the auxiliary particles 20 becomes strong, and when the heat treatment time is shortened, the bonding force becomes weak. When the bonding force between the mother particle 10 and the auxiliary particles 20 is weak, the auxiliary particles 20 may be detached from the mother particle 10 during the polishing process. Therefore, it is preferable that the heat treatment be conducted for a sufficient time such that the mother particle 10 and the auxiliary particles 20 strongly bond to each other. However, when the heat treatment time is too long, since the productivity is reduced, it is preferable that the heat treatment time be within 2 hours to 24 hours. Also, the size of the auxiliary particles 20 may be adjusted according to the heat treatment temperature.

That is, when the heat treatment temperature is high, the size of the auxiliary particles 20 in the same heat treatment time may increase.

For example, although the heat treatment time increases at a temperature of 60° C. or lower, the size of the auxiliary particles 20 does not increase, but as the heat treatment time increases at a temperature exceeding 60° C., the size of the auxiliary particles 20 increases abruptly. However, when the heat treatment temperature is too high, the size of the auxiliary particles 20 becomes too large, so that a new mother particle 10 may be formed. Therefore, it is preferable that the heat treatment be conducted at a temperature higher than 60° C. and not higher than 100° C.

Figure 6:
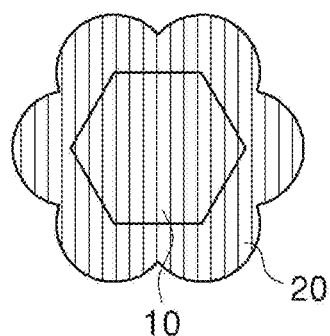
Figure 6:
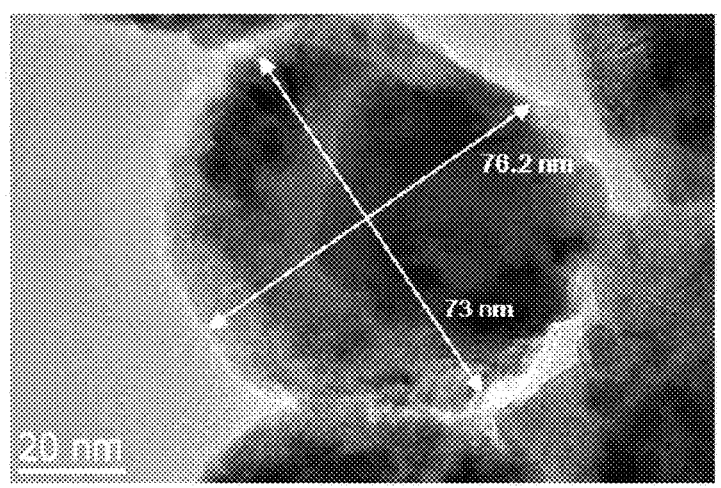

In order to grow the size of the auxiliary particles 20 formed on the surface of the mother particle 10, the growing process of the auxiliary particles 20 may be conducted at least one time. For example, in a state that the atmosphere of inert gas is maintained, the alkaline solution is further added to the mixture solution in which the abrasive particle the mother particle 10 and the auxiliary particles 20 formed on the surface of the mother particle 10 is mixed, and stirring is conducted for a time of 5 hours or less, and a cerium aqueous solution is prepared by mixing cerium and deionized water at a mixing ratio of 2:1 to 4:1, and is then heated from room temperature to 40° C. to a temperature of 100° C. or lower at a temperature rise rate of 0.5° C./min to perform heat treatment for a time of 24 hours or less. The mixture solution which has been subject to the heat treatment is cooled to room temperature within 2 hours. Through the above processes, an abrasive particle having a plurality of auxiliary particles 20 formed on the surface of the mother particle 10 and having a primary particle diameter of 100 nm or less is formed as shown in the schematic view of FIG. 6A and the photograph of FIG. 6B. That is, by repeating the growing process of the auxiliary particles 20, the size of the auxiliary particles 20 increases, so that the auxiliary particles 20 contact each other or overlap each other.

Figure 1:
FIGS. 1 and 2 show photographs of existing dry and wet ceria abrasive particles and schematic views of polishing using these particles.
Figure 1:
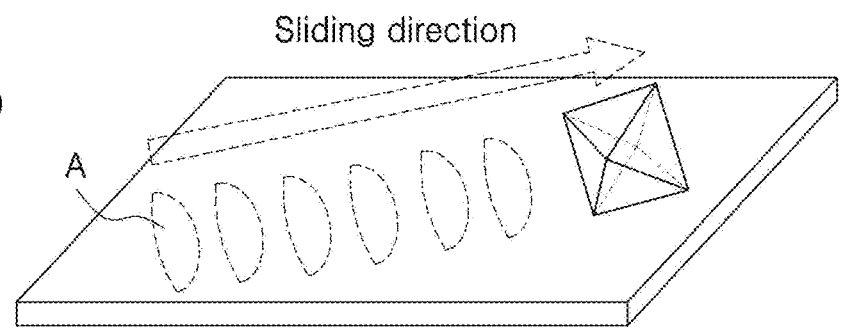
Figure 2:
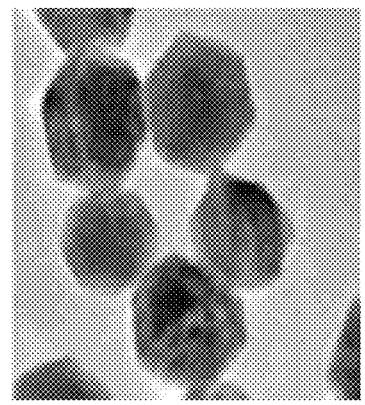
Figure 2:
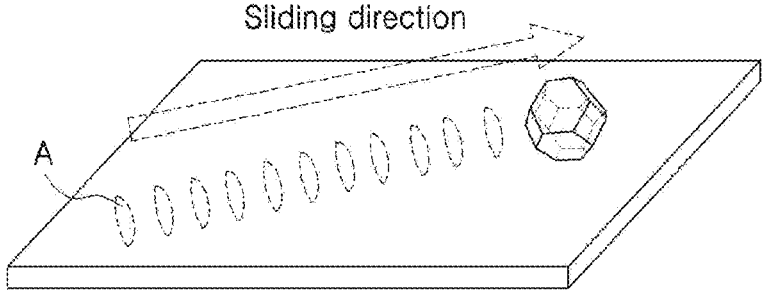
Figure 7:
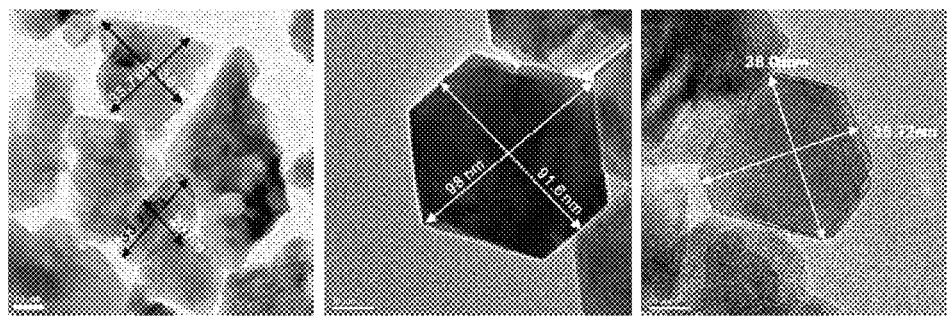
FIG. 7 is photographs for comparison between existing dry and wet abrasive particles and abrasive particles of the present disclosure.
Figure 8:
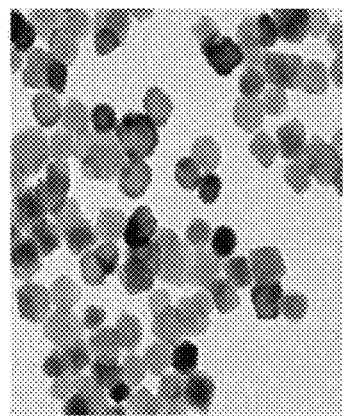
FIG. 8 shows a photograph of abrasive particles according to the present disclosure and a schematic view of polishing using the abrasive particles.
Figure 8:
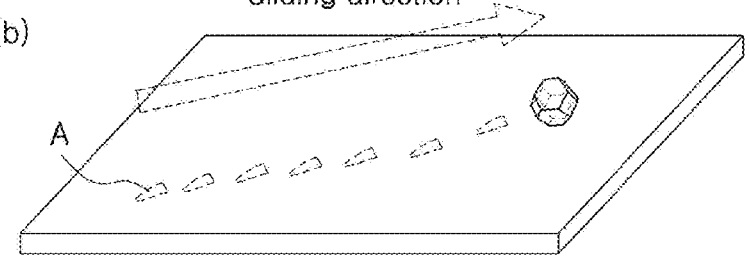
Figure 9:
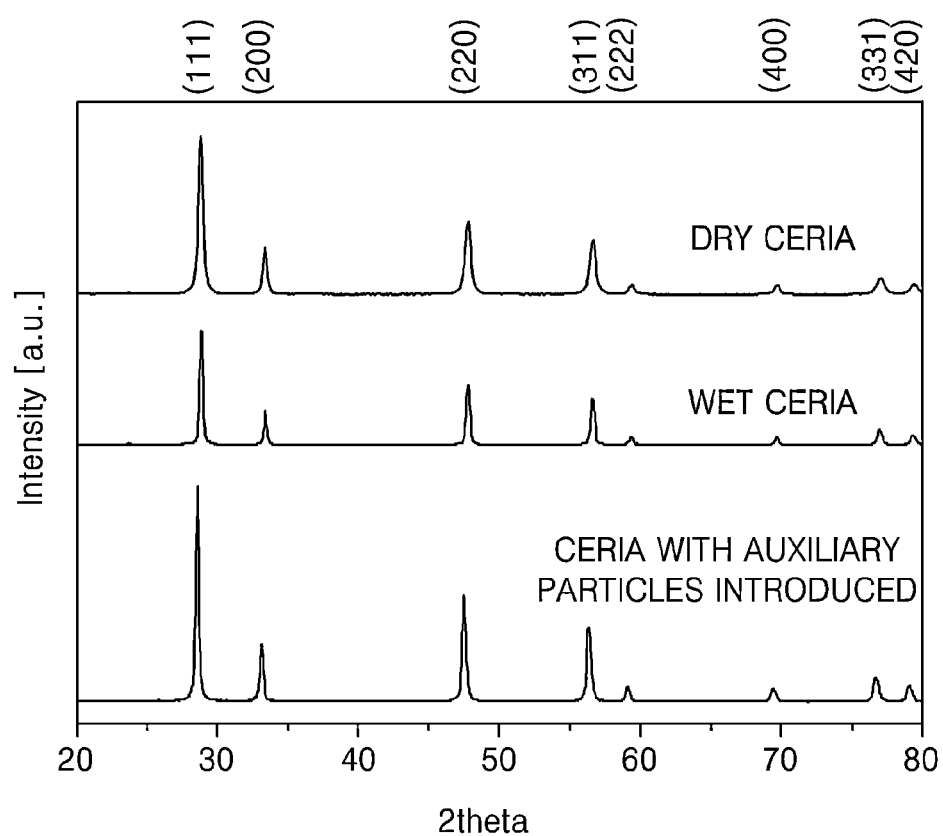
FIG. 9 is an XRD graph of existing dry and wet abrasive particles and abrasive particles of the present disclosure.

As described above, the photographs of the abrasive particle including the mother particle 10 and the auxiliary particles 20 formed on the surface of the mother particle 10 according to the present disclosure and the existing dry and wet ceria particles are shown in FIG. 7 for comparison of shape. That is, FIGS. 7A and 7B are photographs of the existing dry and wet ceria particles and FIG. 7C is the photograph of the abrasive particle according to the present disclosure. As shown in FIG. 7A, since the dry ceria particle is angular in shape of crystal particle and has a wide particle diameter distribution, the application of the dry ceria particle to the CMP process for NAND flash memory devices inevitably generates micro scratches in the polysilicon layer as shown in FIG. 1. Also, as shown in FIG. 7B, since the wet ceria particle has a polyhedral structure and is large in size, the application of the wet ceria particle to the CMP process for NAND flash memory devices inevitably generates micro scratches in the polysilicon layer as shown in FIG. 2. However, as shown in FIG. 7C, since the abrasive particle according to the present disclosure is small in size and does not have sharp crystal faces compared with the existing wet ceria particle, although the abrasive particle is applied to the CMP process for NAND flash memory devices as shown in FIG. 8, a micro scratch is not almost generated in the polishing layer. Also, as seen from the XRD graph of FIG. 9, the ceria abrasive particle according to the present disclosure has almost the same crystallinity as the existing dry and wet ceria particles. Therefore, it may be understood that the ceria abrasive particle according to the present disclosure has a strength that may be used as an abrasive particle in a CMP process for planarizing a device isolation layer.

By mixing the abrasive particle including the mother particle 10 and the auxiliary particles 20 formed on the surface of the mother particle 10 according to an embodiment of the present disclosure in a dispersing agent, a polishing slurry may be manufactured. A polishing accelerating agent, a pH adjusting agent, and the like may be further mixed.

As described above, the abrasive particle includes a ceria mother particle and a plurality of ceria auxiliary particles formed on a surface of the ceria mother particle, and may be contained in an amount of 0.1 wt % to 5 wt %, preferably 0.25 wt % to 2 wt % in the polishing slurry based on the solid component. When the abrasive particle is contained in an amount of 0.1 wt % or less, the polishing rate is too low, and when the abrasive particle is contained in an amount of 5 wt % or more, the polishing rate is too high, so that a target layer to be polished may be over-polished.

The polishing accelerating agent may include an cationic low molecular polymer, an cationic high molecular polymer, a hydroxylic acid, or an amino acid. For example, the cationic low molecular and high molecular polymers may include at least one of an oxalic acid, a citric acid, a polysulfonic acid, a polyacrylic acid, a polymethacrylic acid (Darvan C-N), copolymeric acids thereof, or salts thereof. Also, the hydroxylic acid may include at least one of a hydroxylbenzoic acid, an ascorbic acid, or salts thereof. The amino acid may include at least one of a picolinic acid, a glutaminic acid, a tryptophan acid, an aminobutylic acid, or salts thereof. The polishing accelerating agent may be contained in an amount of 0.01 wt % to 0.1 wt %, and preferably 0.02 wt % to 0.06 wt % based on 1 wt % of the abrasive particle. When the amount of the polishing accelerating agent is less than 0.01 wt % based on the weight of the abrasive particle, the dispersion stability is deteriorated, and when the amount of the polishing accelerating agent exceeds 0.1 wt %, the polishing of the target layer to be polished may be suppressed. Therefore, the weight percentage of the polishing accelerating agent may be adjusted such that the dispersion stability is enhanced and the polishing is not suppressed.

The pH of the polishing slurry may be adjusted to 4 to 9, preferably 5 to 9 by using a pH adjusting agent. When the pH of the polishing slurry is 4 or less, the dispersion stability is deteriorated, and when the pH of the polishing slurry is 9 or higher, the polishing rate of the polishing stop layer, for example, the polysilicon layer sharply increases due to strong alkalinity.

As described above, since the abrasive particle according to an embodiment of the present disclosure is provided with the plurality of auxiliary particles 20 formed on the surface of the mother particle 10, the abrasive particle may decrease the sharp crystal faces of the mother particle 10 to the maximum extend. Therefore, the abrasive particle may suppress the occurrence of micro scratches in the polishing stop layer, for example, the polysilicon layer underlying the target layer to be polished to the maximum extent, thereby enhancing the device reliability and productivity. A method of manufacturing a semiconductor device by using the polishing slurry containing abrasive particles according to an embodiment of the present disclosure will be described with reference to FIGS. 10 to 12.

Figure 10:
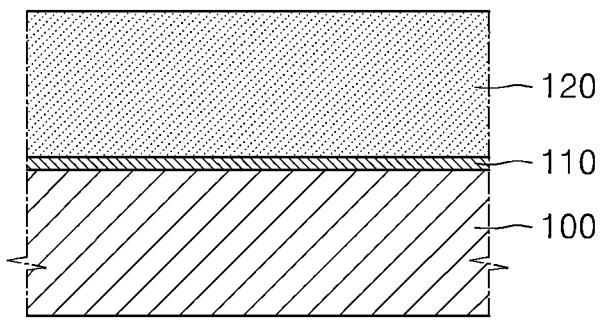
FIGS. 10 to 12 are cross-sectional views illustrating a method of manufacturing a semiconductor device by using a polishing slurry containing abrasive particles according to an embodiment of the present disclosure.

Referring to FIG. 10, a tunnel insulating layer 110 is formed on a substrate 100 and a conductive layer 120 is then formed on the tunnel insulating layer 110. The substrate 100 may be selected from various substrates used in manufacturing semiconductor devices, and may be, for example, a silicon substrate. The tunnel insulating layer 110 may be formed by using an oxide layer (SiO2), a nitride layer (Si3N4), or the like, and may be formed in a single layer structure or a structure having at least two layers. In this regard, the insulating layer 110 may be formed in a thickness that enables tunneling of carriers. Also, the conductive layer 120 may be used as a floating gate of a NAND flash memory device, and may be formed by using a polysilicon layer.

Figure 11:
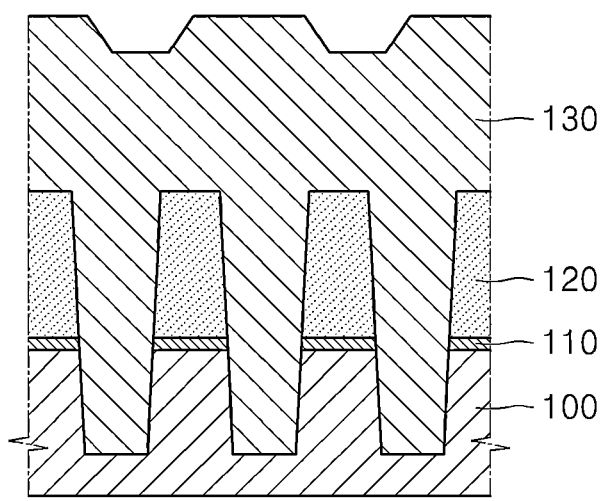

Referring to FIG. 11, predetermine regions of the conductive layer 120, the tunnel insulating layer 110 and the substrate 100 are etched to a predetermined depth of the substrate 100 to form a plurality of trenches. An insulating layer 130 is formed such that the trenches are filled. The insulating layer 130 may be formed of an oxide-based material, for example, at least one of a borophosphosilicate glass (BPSG) layer, a phosphosilicate glass (PSG) layer, a high density plasma (HDP) layer, a tetra ethyl ortho silicate (TEOS) layer, an undoped silica glass (USG) layer, a plasma enhanced tetra ethyl ortho silicate glass (PETEOS) layer, and a high aspect ratio process (HARP) layer. Also, the insulating layer 130 may be formed by a physical vapor deposition (PVD) method, a chemical vapor deposition (CVD) method, a metal organic chemical vapor deposition (MOCVD) method, an atomic layer deposition (ALD) method, or an AL-CVD method in which the CVD method and the ALD method are combined. Meanwhile, a liner oxide layer may be formed on inner side surfaces of the trenches by oxidizing the substrate 100 prior to filling the trenches with the insulating layer 130.

Figure 12:
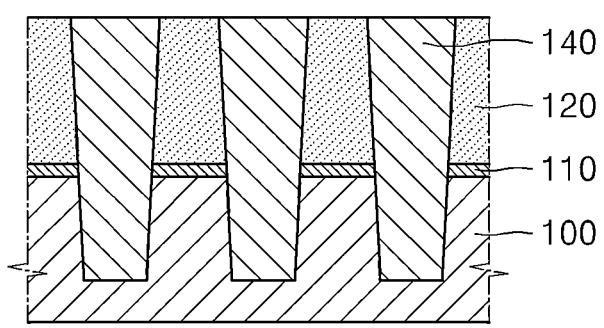

Referring to FIG. 12, the substrate 100 in which the insulating layer 130 is filled in the trenches is loaded in a CMP apparatus and then the insulating layer 130 is polished by using a polishing slurry containing the abrasive particles according to an embodiment of the present disclosure. That is, the insulating layer 130 is polished by using a polishing pad of a polishing apparatus and the polishing slurry until the conductive layer 120 is exposed. Also, for sufficient polishing, the polishing may be further conducted for a predetermined time after the conductive layer 120 is exposed. In this regard, the polishing selection ratio of the insulating layer 130 to the conductive layer 120 is 10:1 to 50:1. Thus, a plurality of device isolation layers 140 are formed between the conductive layers 120.

Although not shown in the drawings, a second conductive layer, such as a polysilicon layer or the like may be formed on the substrate in which the device isolation layers are formed, and then patterned to form a floating gate, and a dielectric layer and a third conductive layer may be formed on the resultant substrate and then patterned to form a control gate. Thus, a NAND flash memory device in which the floating gate and the control gate are stacked may be manufactured.

EXPERIMENTAL EXAMPLES

Preparation of Abrasive Particle

An abrasive particle including a mother particle and a plurality of auxiliary particles formed on a surface of the mother particle according to an embodiment of the present disclosure was prepared as follows. A cerium(III) salt and deionized water were mixed at a mixing ratio of 2:1 to 4:1—for example, 1 kg to 4 kg of cerium(III) salt and 0.25 kg to 2 kg of deionized water to prepare a cerium(III) aqueous solution, and a cerium(IV) salt and deionized water were mixed at a mixing ratio of 1:500 to 1:3000—for example, 1 g to 3 g of cerium(IV) salt and 0.5 kg to 9 kg of deionized water to prepare a cerium(IV) aqueous solution. The cerium(IV) aqueous solution and a nitric acid were mixed at a mixing ratio of 1:1 to 100:1—for example, 1 kg to 5 kg of the cerium(IV) solution and 0.1 kg to 5 kg of the nitric acid, to prepare a cerium(IV) mixture solution. Also, the cerium(III) aqueous solution and the cerium(IV) mixture solution were mixed to prepare a cerium mixture solution. Further, ammonia and deionized water were loaded at a mixing ratio of 1:2 to 1:10—for example, 1 kg to 5 kg of ammonia and 1 kg to 50 kg of deionized water in a reaction container in an inert atmosphere and then stirred to prepare an alkaline aqueous solution. In a state that the cerium mixture solution was put in the reaction container and then stirred while maintaining the inert atmosphere, the cerium mixture solution was heated from room temperature to 100° C. or lower—for example, 70° C. to 90° C. to perform a heat treatment for a time period of 8 hours or less—for example, 1 hour to 4 hours. By performing the heat treatment as above, a mother particle mixture solution in which a protrusion is not introduced on a surface thereof was prepared.

Thereafter, the ceria particle mixture solution was cooled to a temperature of 60° C. or lower—for example, 20° C. to 40° C., and the ceria particle mixture solution and ammonia were put in a reaction container, mixed at a mixing ratio of 10:1 to 2:1—for example, 8 kg to 100 kg of the ceria particle mixture solution and 10 kg to 4 kg of ammonia, and stirred for a few minutes to a few ten minutes in an inert atmosphere. Then, a secondary cerium mixture solution in which 1 kg to 4 kg of a cerium(III) salt, 1 kg to 4 kg of a cerium(IV) salt, 1 kg to 9 kg of deionized water and 0.1 kg to 5 kg of a nitric acid were mixed was added to the ceria mixture solution to which ammonia was added, stirred, and heated to 100° C. or lower—for example, 70° C. to 90° C. to perform a heat treatment for 8 hours or less—for example, for 1 hour to 4 hours. By completing the heat treatment as above, a particle mixture solution in which a primary auxiliary particle having a protrusion shape is formed on a surface of the mother particle was prepared.

Thereafter, the ceria particle mixture solution in which the primary auxiliary particle is formed was cooled to a temperature of 60° C. or lower—for example, 20° C. to 40° C., and the ceria particle mixture solution and ammonia were put in a reaction container, mixed at a mixing ratio of 10:1 to 2:1—for example, 8 kg to 100 kg of the ceria particle mixture solution and 10 kg to 4 kg of ammonia, and stirred for a few minutes to a few ten minutes in an inert atmosphere. Then, a tertiary cerium mixture solution in which 1 kg to 4 kg of a cerium(III) salt, 1 kg to 4 kg of a cerium(IV) salt, 1 kg to 9 kg of deionized water and 0.1 kg to 5 kg of a nitric acid were mixed was added to the ceria mixture solution to which ammonia was added, stirred, and heated to 100° C. or lower—for example, 70° C. to 90° C. to perform a heat treatment for 8 hours or less—for example, 1 hour to 4 hours. By completing the heat treatment as above, a particle mixture solution in which a secondary auxiliary particle having a protrusion shape is formed on a surface of the mother particle was prepared.

The particle mixture solution in which the secondary auxiliary particle is formed on the surface of the mother particle was cooled to room temperature to adjust pH of the mixture solution to an acidic pH of 4 or less, thereby completing the reaction. The mixture solution of which reaction was completed was left in room temperature to deposit the ceria particles having protrusions on a surface thereof, then deposition and washing using deionized water were repeated a few times, and then centrifugation of the mixture solution was performed to finally obtain particles.

Comparison Between Example and Comparative Example

Deionized water was added to a ceria suspension containing ceria abrasive particles having sharp crystal faces of a polyhedral structure according to Comparative Example to dilute the ceria suspension, and a nitric acid ($HNO_3$) or ammonia ($NH_4OH$) was added to adjust the pH of the ceria suspension to 4, 5, and 6. These resultant solutions were sufficiently stirred to prepare polishing slurries according to comparative examples.

Also, deionized water was added to a ceria suspension containing ceria abrasive particles having a plurality of auxiliary particles formed on a surface of the mother particle according to Inventive Example to dilute the ceria suspension, and Darvan C-N was added and then a nitric acid ($HNO_3$) or ammonia ($NH_4OH$) was added to adjust the pH of the ceria suspension to 4, 5, and 6 These resultant solutions were sufficiently stirred and then ultrasonicated to prepare polishing slurries according to Inventive Examples.

Figure 14:
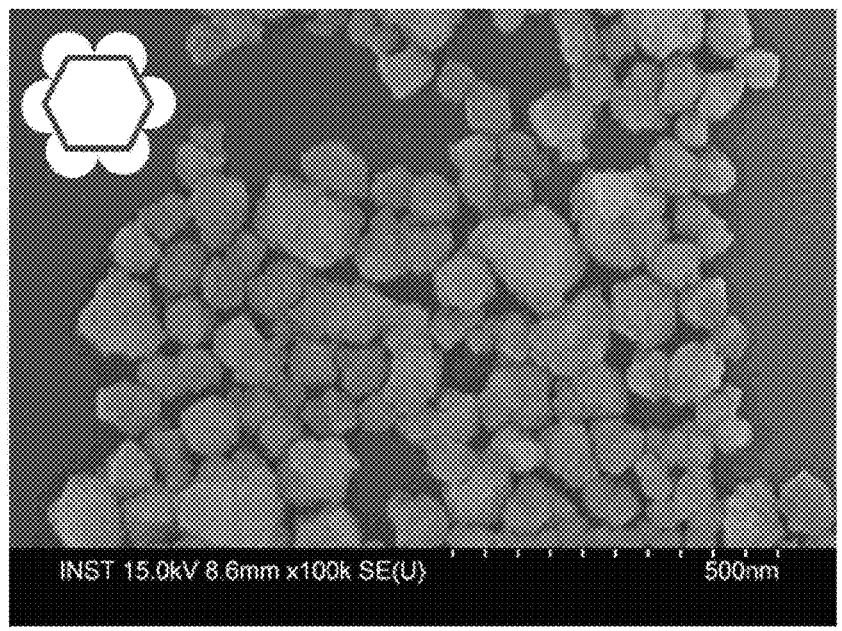
Figure 14:
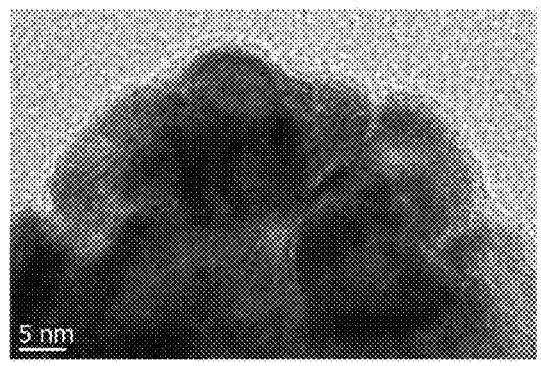
Figure 14:
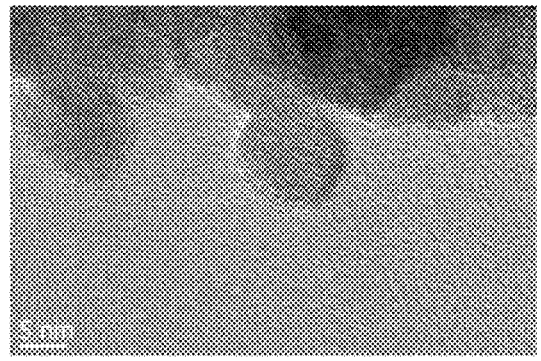

Then, polishing processes were conducted by using the polishing slurries according to Comparative Examples and the polishing slurries. POLI-300 (G&P) was used as a polishing apparatus, and IC 1000/Suba IV CMP pad (Dow chemical) was used as a polishing pad. Also, the falling pressure of the polishing pad was set to 6 psi and the rotational speeds of a table and a spindle were all set to 70 rpm. Under such conditions, the polishing slurries according to Comparative Examples and Examples were supplied at a flow rate of 100 ml/min to polish a 250 nm thick PETEOS layer formed on a 75 nm thick polysilicon layer for 60 seconds. The polishing results according to Comparative Examples and Examples are shown in Table 1. Also, the shapes of the abrasive particles according to Comparative Examples and Examples are shown in the photographs of FIG. 14.

TABLE 1

| | | Comparative Example | Example |
|---|---|---|---|
| Shape | | Polyhedron | Nano embossing |
| Primary particle diameter (nm) | | 78.58 | 77.25 |
| Secondary particle diameter (nm) | | 157.5 | 157.4 |
| Zeta Potential (mV) | | 46.58 | −50.02 |
| PETEOS polishing rate (Å/min) | | 1131 | 1531 |
| Adding of Polysilicon Stop additive | Polishing rate of PETEOS (Å/min) | 472 | 680 |
| | Polishing rate of Polysilicon (Å/min) | <20 | <20 |
| Thickness of Residual Polysilicon (nm) | | 74.4 ± 0.9 | 73.8 ± 1.4 |

Figure 13:
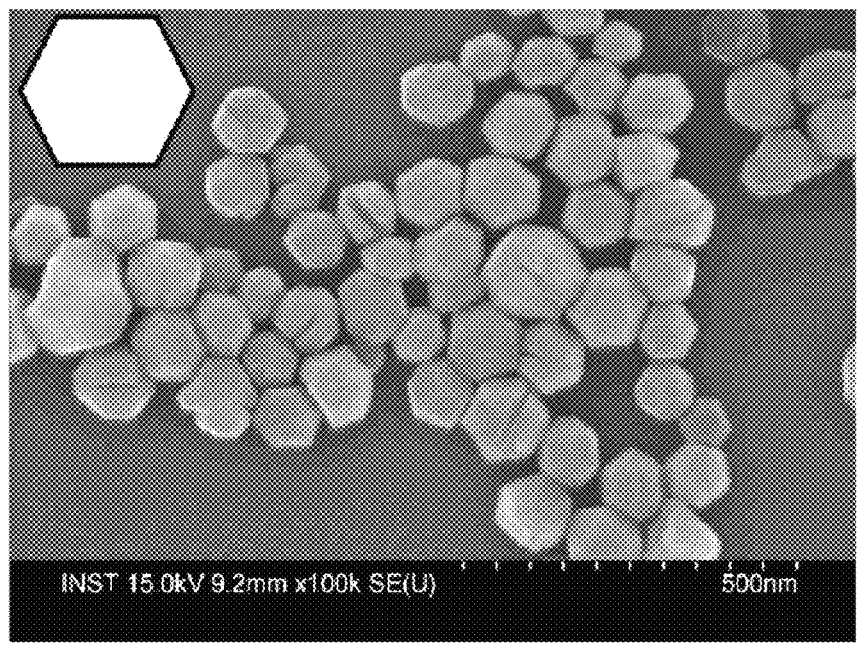
FIGS. 13 and 14 are photographs of abrasive particles according to comparative examples and inventive examples.
Figure 13:
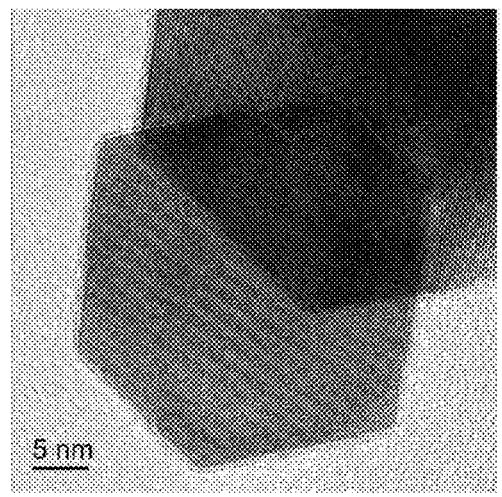
Figure 15:
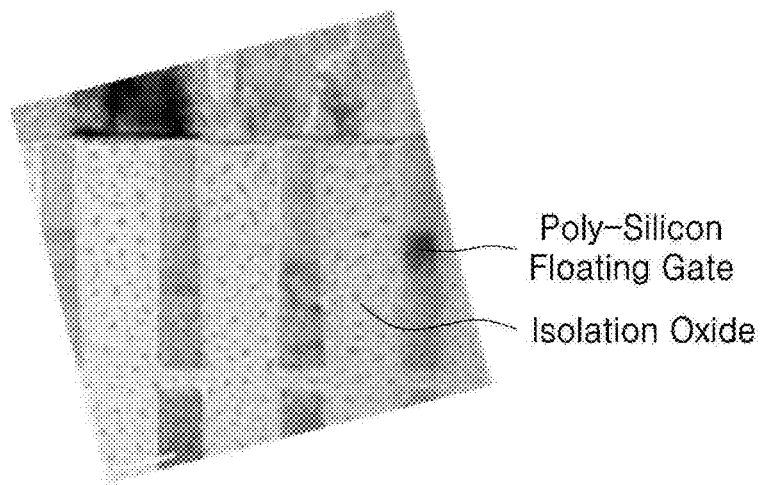
FIGS. 15 and 16 are photographs of sections of substrates after the substrates are subject to CMP processes by using slurries containing abrasive particles according to a comparative example and an example of the present disclosure.
Figure 16:
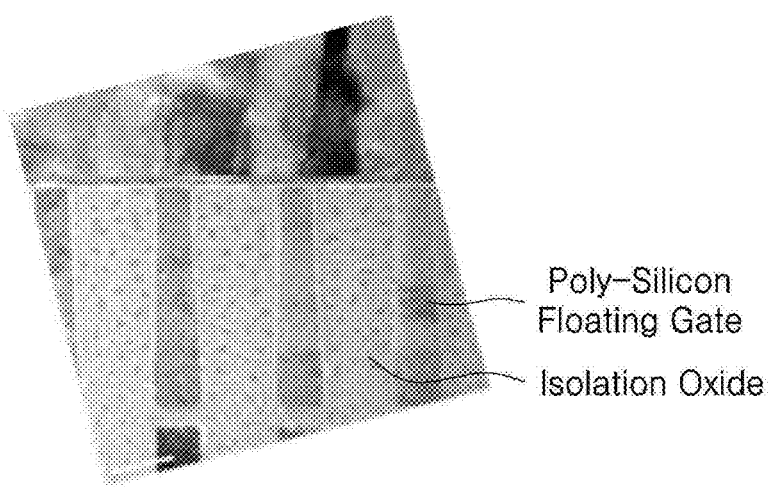

First, as shown in FIG. 13, it may be seen that the abrasive particles according to Comparative Examples have a polyhedral structure and sharp crystal faces. However, as shown in FIG. 14, it can be seen that the abrasive particles according to Examples of the present disclosure have a nano-embossing structure in which protrusion-shaped auxiliary particles are formed on a surface of the mother particle. Also, as shown in Table 1, the ceria abrasive particles according to Comparative Examples and the ceria abrasive particles according to Inventive Examples have almost similar primary and secondary particle diameters. That is, the abrasive particles according to Comparative Examples have a first particle diameter of 96.7 nm and a secondary particle diameter of 157.5 nm, and the abrasive particles according to Inventive Examples have a primary particle diameter of 83.7 nm and a secondary particle diameter of 157.4 nm Herein, the primary particle diameter indicates an average particle diameter of the ceria abrasive particles, and the secondary particle diameter indicates an average particle diameter when the ceria particles are agglomerated. However, the ceria abrasive particles according to Comparative Examples have a surface Zeta potential of 46.58 mV, and the ceria abrasive particles according to Examples have a surface Zeta potential of −50.02 mV that is opposite in polarity to the surface Zeta potential of Comparative Examples. Also, in case of oxides, the polishing rate of the slurry according to Comparative Examples was 1,131 Å/min, and the polishing rate of the slurry according to Inventive Examples was 1,531 Å/min, and it can be seen from these results that the polishing rate of the inventive slurry is more excellent than that of the slurry according to Comparative Examples. Also, even in case a polishing stop additive was added, the oxide polishing rate of the slurry according to Inventive Examples was 680 Å/min and the oxide polishing rate of the slurry according to Comparative Example was 472 Å/min, and it can be seen from these results that the polishing rate of the inventive slurry is more excellent than that of the slurry according to Comparative Examples. Meanwhile, from comparison results of TEM images after pattern CMP shown in FIGS. 15 and 16, it may be seen that there are no remarkable differences in dishing, thickness of residual polysilicon, or the like.

Figure 17:
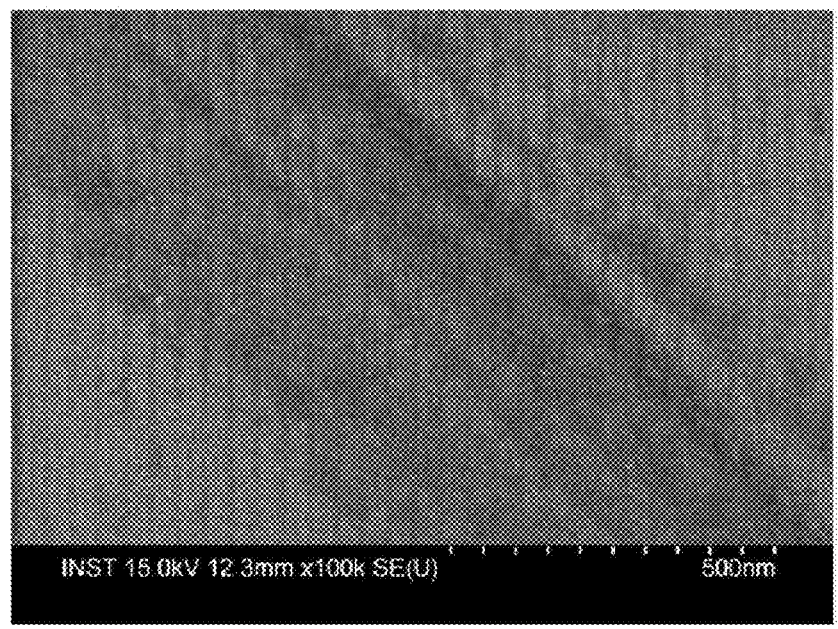
FIGS. 17 and 18 are photographs of surfaces of polishing stop layers after substrates are subject to CMP processes by using slurries containing abrasive particles according to a comparative example and an example of the present disclosure.
Figure 18:
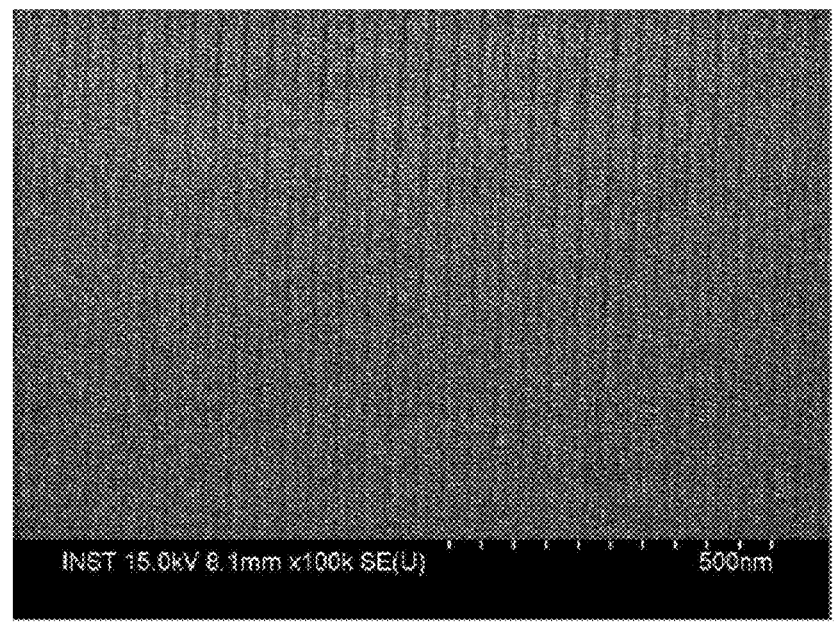

However, in the case of the ceria slurry according to Comparative Example, many micro scratches viewed as stain occurred as shown in FIG. 17, but in the case of the ceria slurry according to Inventive Example, micro scratches did not occur in a polysilicon layer as shown in FIG. 18. Resultantly, compared with the ceria abrasive particles according to Comparative Examples, the ceria abrasive particles according to Inventive Example may enhance the polishing rate of oxides as well as decreasing the occurrence of micro scratches in the underlying polysilicon layer.

According to the embodiments of the present disclosure, since the abrasive particle includes a mother particle having a polyhedral structure, and a plurality of auxiliary particles provided on a surface of the mother particle, the abrasive particle may decrease sharp crystal faces of the mother particle to the maximum extent. Also, a polishing slurry may be manufactured by using such abrasive particles, and the manufactured polishing slurry may be used to polish an upper oxide-based material layer in a process of manufacturing 20 nm or less NAND flash memory devices in which a polysilicon layer used as a floating gate is used as a polishing stop layer.

Therefore, the occurrence of micro scratches in the polysilicon layer underlying the target layer to be polished may be suppressed to the maximum extent, and thus a change in threshold voltage may be prevented, thereby enhancing the device reliability. Furthermore, the polishing rate of an oxide layer may be improved and the polishing selection ratio of an oxide layer and a polysilicon layer may be improved, thus decreasing the polishing process time to enhance the productivity.

Although the abrasive particle, the polishing slurry, and the method of manufacturing semiconductor device using the same have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. An abrasive particle comprising:
a mother particle having a polyhedral crystal face; and
a plurality of auxiliary particles which are formed on a surface of the mother particle and grown and protruded outward,
wherein the mother particle and the auxiliary particles are formed from the same material, and the plurality of auxiliary particles are respectively grown and formed from an edge portion of the mother particle,
wherein each of the mother particle and the auxiliary particles comprises a ceria particle.

2. The abrasive particle of claim 1, wherein the plurality of auxiliary particles are formed so as to cover a portion of each of crystal faces centered on an edge portion where at least three crystal faces among the polyhedral crystal faces meet.

3. The abrasive particle of claim 2, wherein the plurality of auxiliary particles adjacent to each other are spaced apart from each other or contact each other.

4. The abrasive particle of claim 3, wherein the plurality of auxiliary particles contacting each other have an overlapping height ranging from 0% to 70% to a maximum height thereof.

5. The abrasive particle of claim 1, wherein the auxiliary particle to the mother particle is formed at a size ratio of 100:1 to 5:1.

6. The abrasive particle of claim 5, having an average particle diameter ranging from 6 nm to 350 nm.

7. The abrasive particle of claim 6, wherein the mother particle has an average particle diameter ranging from 5 nm to 300 nm.

8. The abrasive particle of claim 7, wherein the auxiliary particle has an average particle diameter ranging from 1 nm to 50 nm.

9. A slurry for polishing a target workpiece, comprising:
an abrasive particle performing polishing and comprising a mother particle having a polyhedral crystal face and a plurality of auxiliary particles protruded outward from a surface of the mother particle; and
a dispersing agent containing deionized water, in which the abrasive particle is dispersed,
wherein the mother particle and the auxiliary particles are formed from the same material, and the plurality of auxiliary particles are respectively grown and formed from an edge portion of the mother particle,
wherein each of the mother particle and the auxiliary particles comprises a ceria particle.

10. The slurry of claim 9, wherein in the abrasive particle the plurality of auxiliary particles are formed and grown from an edge where at least two of the polyhedral crystal faces meet.

11. The slurry of claim 10, wherein the protrusions to the polyhedral crystal faces are formed at a size ratio of 100:1 to 5:1.

12. The slurry of claim 11, wherein the abrasive particle is contained in an amount ranging from 0.1 wt % to 5 wt % based on a solid content.

13. The slurry of claim 9, further comprising a polishing accelerating agent accelerating polishing,
wherein the polishing accelerating agent comprises a cationic low molecular weight polymer, a cationic high molecular weight polymer, a hydroxylic acid, and an amino acid, which convert a surface potential of the abrasive particle to a minus potential.

14. The slurry of claim 13, wherein the polishing accelerating agent is contained in an amount of 0.01 wt % to 0.1 wt % based on 1 wt % of the abrasive particle.

15. The slurry of claim 14, wherein the cationic low molecular and high molecular polymers comprise at least one of an oxalic acid, a citric acid, a polysulfonic acid, a polyacrylic acid, a polymethacrylic acid (Darvan C-N), copolymeric acids thereof, or salts thereof, the hydroxylic acid comprises at least one of a hydroxylbenzoic acid, an ascorbic acid, or salts thereof, and the amino acid comprises at least one of a picolinic acid, a glutaminic acid, a tryptophan acid, an aminobutylic acid, or salts thereof.

16. The slurry of claim 9, further comprising a pH adjusting agent adjusting pH of the slurry,
wherein the slurry has a pH which is maintained in a range of 4 to 9 by the pH adjusting agent.

17. The slurry of claim 13, further comprising a pH adjusting agent adjusting pH of the slurry,
wherein the slurry has a pH which is maintained in a range of 4 to 9 by the pH adjusting agent.

* * * * *